US009024303B2

(12) United States Patent
Park et al.

(10) Patent No.: US 9,024,303 B2
(45) Date of Patent: May 5, 2015

(54) ORGANIC LIGHT EMITTING DISPLAY AND MANUFACTURING METHOD THEREOF

(71) Applicants: Jin-Woo Park, Yongin (KR);
Myung-Jong Jung, Yongin (KR);
Sung-Woo Cho, Yongin (KR);
Hyung-Tag Lim, Yongin (KR)

(72) Inventors: Jin-Woo Park, Yongin (KR);
Myung-Jong Jung, Yongin (KR);
Sung-Woo Cho, Yongin (KR);
Hyung-Tag Lim, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/963,278

(22) Filed: Aug. 9, 2013

(65) Prior Publication Data
US 2014/0284565 A1    Sep. 25, 2014

(30) Foreign Application Priority Data
Mar. 25, 2013  (KR) .................. 10-2013-0031580

(51) Int. Cl.
| H01L 29/08 | (2006.01) |
| H01L 35/24 | (2006.01) |
| H01L 51/00 | (2006.01) |
| H01L 51/50 | (2006.01) |
| H01L 51/56 | (2006.01) |

(52) U.S. Cl.
CPC .............. *H01L 51/504* (2013.01); *H01L 51/56* (2013.01)

(58) Field of Classification Search
CPC ....... H01L 51/504; H01L 51/52; H01L 51/56; H01L 27/3211
USPC ...................... 257/E33.012, E51.022, 40, 89; 313/501–511
See application file for complete search history.

(56) References Cited

U.S. PATENT DOCUMENTS

| 7,470,933 | B2 * | 12/2008 | Lee et al. .................... 257/79 |
| 2004/0217694 | A1 * | 11/2004 | Cok et al. ..................... 313/504 |
| 2005/0280355 | A1 * | 12/2005 | Lee et al. ..................... 313/503 |
| 2007/0296334 | A1 * | 12/2007 | Matsuda ....................... 313/506 |

FOREIGN PATENT DOCUMENTS

| KR | 10-2006-0045225 A | 5/2006 |
| KR | 10-2007-0081965 A | 8/2007 |
| KR | 10-2011-0109559 A | 10/2011 |
| KR | 10-2011-0110589 A | 10/2011 |

* cited by examiner

Primary Examiner — Telly Green
(74) Attorney, Agent, or Firm — Lee & Morse, P.C.

(57) ABSTRACT

An OLED display and associated methods, including a substrate; a first electrode; a second electrode; and an organic emission layer between the first and second electrodes, the organic emission layer including first-third organic emission layers, wherein the third organic emission layer is commonly disposed on the first electrode in the first-third subpixels, the first organic emission layer is in the first subpixel, the second organic emission layer is on the third organic emission layer in the first to third subpixels, an intermediate layer is between the first organic emission layer and the third organic emission layer in the first subpixel and between the second organic emission layer and the third organic emission layer in the second subpixel, and a HTL is between the first organic emission layer and the intermediate layer in the first subpixel and between the second organic emission layer and the intermediate layer in the second subpixel.

6 Claims, 7 Drawing Sheets

ORGANIC LIGHT EMITTING DISPLAY AND MANUFACTURING METHOD THEREOF

CROSS-REFERENCE TO RELATED APPLICATION

Korean Patent Application No. 10-2013-0031580 filed on Mar. 25, 2013, in the Korean Intellectual Property Office, and entitled: "ORGANIC LIGHT EMITTING DISPLAY AND THE MANUFACTURING METHOD THEREOF," is incorporated by reference herein in its entirety.

BACKGROUND

1. Field

Embodiments relate to an organic light emitting diode (OLED) display and a manufacturing method thereof.

2. Description of the Related Art

An organic electroluminescent display element may include a lower electrode and an upper electrode on an insulation substrate, and a multi-layered organic layer formed between the upper and lower electrodes. The organic layer may be selected from a hole injection layer (HIL), a hole transport layer (HTL), an emission layer, a hole suppress layer, an electron transport layer (ETL), and an electron injection layer (EIL) according to each function. In the display element having the above structure, as the upper electrode and the lower electrode are formed of a transparent or non-transparent electrode, light may be emitted in a direction of the insulation substrate or in a direction opposite to the insulation substrate, or may be emitted to both sides in the direction of the insulation substrate and the opposite direction of the insulation substrate. The hole injection layer (HIL) and the hole transport layer (HTL) (as charge transport layers) may be formed on an entire surface of the substrate, R, G, and B emission layers may be respectively formed by using a shadow mask, and the hole injection layer (HIL) and the hole transport layer (HTL) (as the charge transport layer) may again formed on the entire surface of the substrate.

The above information disclosed in this Background section is only for enhancement of understanding of the background of the invention and therefore it may contain information that does not form the prior art that is already known in this country to a person of ordinary skill in the art.

SUMMARY

An exemplary embodiment provides an organic electric field light emitting element manufacturing by only using three FMMs and a manufacturing method thereof.

According to an embodiment, an organic light emitting diode (OLED) display including a first subpixel, a second subpixel, and a third subpixel of different colors includes: a substrate; a first electrode disposed on the substrate; a second electrode disposed on the first electrode to face the first electrode; and an organic emission layer disposed between the first electrode and the second electrode and including a first organic emission layer, a second organic emission layer, and a third organic emission layer. The third organic emission layer is commonly disposed on the first electrode in the first subpixel, the second subpixel, and the third subpixel, the first organic emission layer is disposed in the first subpixel, the second organic emission layer is disposed on the third organic emission layer in the first subpixel, the second subpixel, and the third subpixel, an intermediate layer is disposed between the first organic emission layer and the third organic emission layer in the first subpixel and between the second organic emission layer and the third organic emission layer in the second subpixel, and a hole transport layer (HTL) is formed between the first organic emission layer and the intermediate layer in the first subpixel and between the second organic emission layer and the intermediate layer in the second subpixel.

A distance from the third organic emission layer to the second electrode may be uniform in the first subpixel, the second subpixel, and the third subpixel.

A thickness of the second emission layer in the second subpixel may be thinner than the thickness of the second emission layer in the third subpixel and may be thicker than the thickness of the second emission layer in the first subpixel.

The first organic emission layer may emit red visible rays, the second organic emission layer may emit green visible rays, and the third organic emission layer may emit blue visible rays.

The intermediate layer may include one selected from a group including hexaazatriphenylene-hexacarbonitrile (HAT-CN), $MoO_3$, and fullerene C60.

The hole injection layer (HIL) may be commonly disposed between the first electrode and the third organic emission layer in the first subpixel, the second subpixel, and the third subpixel.

According to an embodiment, a method of manufacturing an organic light emitting diode (OLED) display including a first organic emission layer, a second organic emission layer, and a third organic emission layer includes: depositing a first common layer on a substrate; depositing a patterned organic layer on a donor film; transferring the patterned organic layer on the first common layer by using a laser; and depositing a second common layer on the first common layer and the patterned organic layer.

The depositing of the first common layer may include: forming the first electrode on the substrate; depositing the hole injection layer (HIL) on the first electrode; and depositing the third organic emission layer on the hole injection layer (HIL), wherein the first electrode, the hole injection layer (HIL), and the third organic emission layer are commonly disposed in a first subpixel, a second subpixel, and a third subpixel of different colors in the organic light emitting diode (OLED) display.

The depositing of the patterned organic layer on the donor film may include: depositing the patterned first organic emission layer on the donor film; depositing the first hole transport layer (HTL) on the first organic emission layer; and depositing the intermediate layer on the first hole transport layer (HTL).

The depositing of the patterned organic layer on the donor film may include depositing the second hole transport layer (HTL) on the donor film, and depositing the intermediate layer on the second hole transport layer (HTL).

The depositing of the second common layer on the first common layer and the patterned organic layer may include depositing the second organic emission layer on the first common layer and the patterned organic layer, and forming the second electrode on the second organic emission layer.

The first organic emission layer may emit red visible rays, the second organic emission layer may emit green visible rays, and the third organic emission layer may emit blue visible rays.

DETAILED DESCRIPTION

Figure 1:
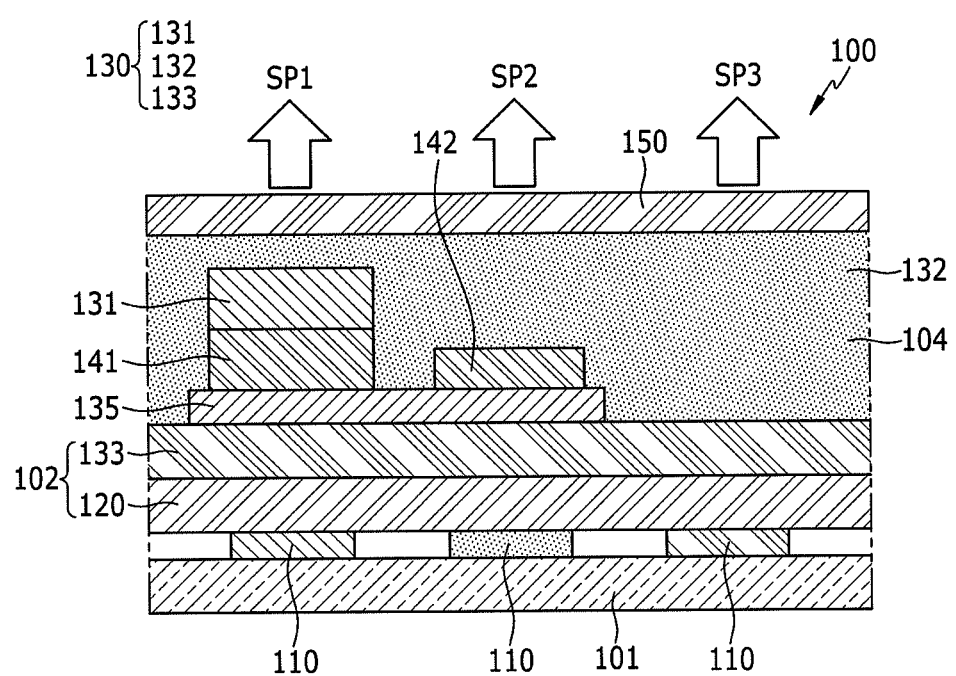
FIG. 1 illustrates a schematic cross-sectional view of an organic light emitting diode (OLED) display according to an exemplary embodiment.

The embodiments will be described more fully hereinafter with reference to the accompanying drawings. As those skilled in the art would realize, the described embodiments may be modified in various different ways, all without departing from the spirit or scope of the embodiments. The drawings and description are to be regarded as illustrative in nature and not restrictive. Like reference numerals designate like elements throughout the specification.

In the explanations of each drawing, like numbers were used as like constituent elements. In the accompanying drawings, the dimensions of the structure may be exaggerated and shown for clarity of the embodiments. The terms of first, second, or the like may be used to describe the various constituent elements, but the constituent elements should not be limited by the above terms. The terms are only used to distinguish one constituent element from the other constituent element. For example, a first constituent element could be termed a second constituent element, and similarly, a second constituent element could be termed a first constituent element, without departing from the scope of the embodiments. Unless explicitly described to the contrary, the representation of the singular includes representation of multiple.

In this application, it should be understood that a term such as "comprises" or "having" is used to specify the presence of features, numbers, steps, operations, constituent elements, parts, or any combination of them described in the specification, but it does not preclude the possibility of the presence or addition of one or more other features, numbers, steps, operations, constituent elements, parts, or any combination of them. When a portion of a layer, film, region, plate, or the like is referred to as being "on" another portion, it can be directly on the other portion or an intervening portion may be present. In contrast, when a portion of a layer, film, region, plate, or the like is referred to as being "below" another portion, it can be directly below the other portion or an intervening portion may be present.

FIG. 1 illustrates a schematic cross-sectional view of an organic light emitting diode (OLED) display according to an exemplary embodiment.

An organic light emitting diode (OLED) display 100 according to the present exemplary embodiment may include a first subpixel SP1, a second subpixel SP2, and a third subpixel SP3. Each of the subpixels SP1, SP2, and SP3 may be a subpixel of different colors, and in the present exemplary embodiment, the first subpixel SP1 may be defined as a red subpixel, the second subpixel SP2 may be defined as a green subpixel, and the third subpixel SP3 may be defined as a blue subpixel.

FIG. 1 shows one first subpixel SP1, one second subpixel SP2, and one third subpixel SP3, however this is for better understanding and ease of description, and the organic light emitting diode (OLED) display 100 may include a plurality of first subpixels SP1, a plurality of second subpixels SP2, and a plurality of third subpixels SP3.

The organic light emitting diode (OLED) display 100 according to an exemplary embodiment may include a substrate 101, a first electrode 110, a second electrode 150, and an organic emission layer 130. For example, the first electrode 110, a hole injection layer (HIL) 120, and a third organic emission layer 133 may be commonly disposed in the first subpixel SP1, the second subpixel SP2, and the third subpixel SP3. Also, in the first subpixel SP1, a second organic emission layer 132, a first organic emission layer 131, a first hole transport layer (HTL) 141, and an intermediate layer 135 may be disposed between the second electrode 150 and the third organic emission layer 133. In the second subpixel SP2, the second organic emission layer 132, a second hole transport layer (HTL) 142, and the intermediate layer 135 may be disposed between the second electrode 150 and the third organic emission layer 133. In the third subpixel SP3, the second organic emission layer 132 may be disposed between the second electrode 150 and the third organic emission layer 133.

In an implementation, the substrate 101 may be made of a transparent glass material that contains $SiO_2$ as a main component. The substrate 101 is not always limited thereto, and may be formed of a transparent plastic material. The plastic material may be an organic material selected from the group of polyethersulphone (PES,), polyacrylate (PAR), polyetherimide (PEI), polyethylene naphthalate (PEN,), polyethylene terephthalate (PET,), polyphenylene sulfide(PPS), polyallylate, polyimide, polycarbonate (PC), cellulose triacetate (TAC), and cellulose acetate propionate (CAP).

In an implementation, the substrate 101 may be formed of carbon or a metal. When forming the substrate 101 of carbon or the metal, the substrate 101 may include one selected from the group of carbon, iron, chromium, manganese, nickel, titanium, molybdenum, stainless steel (SUS), Invar alloys, Inconel alloys, and Kovar alloys, but is not limited thereto. The substrate 101 may be made of a metal foil.

A smoothing surface may be formed on the substrate 101, and a protection layer (not shown) preventing an impurity from penetrating into the substrate 101 may be formed on the substrate 101. The protection layer (not shown) may be formed of $SiO_2$ and/or $SiN_x$.

The first electrode 110 may be formed with a predetermined pattern by a photolithography method. The first electrode 110 may be a reflective electrode or a transmissive electrode. When the first electrode 110 is a reflective electrode, after forming the reflective layer made of Ag, Mg, Al, Pt, Pd, Au, Ni, Nd, Ir, Cr, Li, Ca, or compounds thereof, ITO, IZO, ZnO, or $In_2O_3$ having a high work function may be disposed thereon to form the first electrode 110. When the first electrode 110 is a transmissive electrode, the first electrode 110 may be formed of ITO, IZO, ZnO, or $In_2O_3$ having the high work function.

In the present exemplary embodiment, it is assumed that the first electrode 110 is an anode and the second electrode 140 is a cathode, however polarities of the electrodes may be reversed.

The hole injection layer (HIL) 120 may be formed on the first electrode 110. However the embodiments are not limited thereto. A hole transport layer (HTL) may be disposed on the hole injection layer (HIL) 120, and/or both layers may not be disposed.

The organic emission layer 130 may be formed on the hole injection layer (HIL) 120. The organic emission layer 130 may include the first organic emission layer 131, the second organic emission layer 132, and the third organic emission layer 133.

For example, the third organic emission layer 133 (as the common layer) may be formed on the hole injection layer (HIL) 120 throughout the first subpixel SP1, the second subpixel SP2, and the third subpixel SP3.

The third organic emission layer 133 may emit blue visible rays, and may include oxadiazole dimer dyes (Bis-DAP-DXP), spiro compounds (Spiro-DPVBi, Spiro-6P), triarylamine compounds, bis(styryl)amine (DPVBi, DSA), 4,4'-bis(9-ethyl-3-carbazovinylene)-1,1'-biphenyl (BCzVBi), perylene, 2,5,8,11-tetra-tert-butylDeletedTextsperylene (TPBe), 9H-carbazol-3,3'-(1,4-phenylene-di-2,1-ethenediyl)bis[9-ethyl-9C] (BCzVB), 4,4-bis[4-(di-p-tolylamino)stilyl]biphenyl (DPAVBi), 4-(di-p-tolylamino)-4'-[(di-p-tolylamino)stilyl]stilbene (DPAVB), 4,4'-bis[4-(diphenylamino)stilyl]biphenyl (BDAVBi), bis(3,5-difluoro-2-(2-pyridyl) phenyl-(2-carboxypyridyl)iridium III (FIrPic) as a blue light emitting material, and a high polymer light emitting material such as a polyfluorene-based polymer and a polyvinyl-based polymer may be included.

In the first subpixel SP1 and the second subpixel SP2, an intermediate layer 135 may be disposed on the third organic emission layer 133. The intermediate layer 135 may include one selected from the group of hexaazatriphenylene hexacarbonitrile (HAT-CN), $MoO_3$, and fullerene C60. In an implementation, the intermediate layer 135 may include 1,4,5,8,9,11-hexaazatriphenylene hexacarbonitrile.

The intermediate layer 135 may trap remaining electrons after the electrons and the holes are recombined. For example, the intermediate layer 135 may be positioned between the third organic emission layer 133 and the first and second organic emission layers 131 and 132, thereby helping to prevent the electrons inserted through the cathode from flowing into the hole transport layer (HTL) 141 and 142 and the hole injection layer (HIL) 120 through the organic emission layer 130, and the third organic emission layer 133 also controls a moving speed of the holes. A detailed description thereof will be given below.

In the first subpixel SP1, the first hole transport layer (HTL) 141 and the first organic emission layer 131 may be formed on the intermediate layer 135. The first organic emission layer 131 may emit red visible rays, and may include tetraphenylnaphthacene rubrene, tris(1-phenyl isoquinoline) iridium(III) (Ir(piq)$_3$), bis(2-benzo[b]thiophene-2-yl-pyridine) (acetylacetonate) iridium(III) (Ir(btp)$_2$(acac)), tris(dibenzoylmethane)phenanthroline europium(III) (Eu(dbm)$_3$(phen)), tris[4,4'-di-tert-butyl-(2,2')-bipyridine] ruthenium(III) complex(Ru(dtb-bpy)$_3$*2PF$_S$), DCM1, DCM2, Eu(thenoyltrifluoroacetone)$_3$(Eu(TTA)3, butyl-6-(1,1,7,7-tetramethyl juloldiyl-9-enyl)-4H-pyran) (butyl-6-(1,1,7,7-tetramethyljuloldiyl-9-enyl)-4H-pyran: DCJTB), and a high polymer light emitting material such as a polyfluorene-based polymer and a polyvinyl-based polymer may be included.

Also, in the first subpixel SP1, the second organic emission layer 132 may be positioned on the first organic emission layer 131.

The second organic emission layer 132 may emit, e.g., green, light and may include 3-(2-benzothia benzothiazolyl)-7-(diethylamino) (coumarin 6) 2,3,6,7-tetrahydro-1,1,7,7,-tetrametyl-1H, 5H,11H-10-(2-benzothiazolyl)quinolizino-[9,9a,1gh]coumarin (C545T), N,N'-dimetyl-quinacridone (DMQA), tris(2-phenylpyridine)iridium(III) (Ir(ppy)$_3$) as a green light emitting material, and a high polymer light emitting material such as a polyfluorene-based polymer and a polyvinyl-based polymer may be included.

The second electrode 150 may be a transmissive electrode or a reflective electrode. When the second electrode 150 is the transmissive electrode, the second electrode 150 may be formed by forming an assistance electrode or a bus electrode line made of a transparent conducting material such as ITO, IZO, ZnO, or $In_2O_3$ thereon after depositing the metal having a low work function such as Ag, Mg, Al, Pt, Pd, Au, Ni, Nd, Ir, Cr, Li, Ca, and compounds thereof. When the second electrode 150 is the reflective electrode, the second electrode 150 may be formed of the metal having the low work function such as Ag, Mg, Al, Pt, Pd, Au, Ni, Nd, Ir, Cr, Li, and Ca. A sealing member (not shown) may be disposed on the second electrode 150, e.g., to face one surface of the substrate 101. The sealing member (not shown) may help protect the organic emission layer from external moisture or oxygen, and may be formed of a transparent material. In an implementation, the sealing member may be formed of an overlapping structure including glass, plastic, or an organic material and a plurality of inorganic materials.

Meanwhile, according to an exemplary embodiment, the second electrode 150 may be separated from the substrate 101 by a same distance throughout the first to third subpixels SP1, SP2, and SP3. For example, in an exemplary embodiment, an entire thickness of each organic emission layer 130 may be the same in the first to third subpixels SP1, SP2, and SP3.

Meanwhile, in the second subpixel SP2, the second organic emission layer 132, the second hole transport layer (HTL) 142, and the intermediate layer 135 may be disposed between the second electrode 150 and the third organic emission layer 133 as the common layer. At this time, the second organic emission layer 132 in the second subpixel SP2 may have a thicker thickness than the second organic emission layer 132 in the first subpixel SP1. The second hole transport layer (HTL) 142 and the intermediate layer 135 may be formed similar to the first hole transport layer (HTL) 141 and the intermediate layer 135 in the first subpixel SP1.

Meanwhile, in the third subpixel SP3, the second organic emission layer 132 may only be disposed, and the intermediate layer may not be disposed between the second electrode 150 and the third organic emission layer 133 of the common layer.

In an exemplary embodiment, if the remaining electrons undesirably flow into the organic layer, e.g., the third organic emission layer 133, the hole injection layer (HIL) 120, or the hole transport layer (HTL) 141 and 142, a life-span of the organic light emitting diode (OLED) display 100 may be reduced. However, in an exemplary embodiment, the remaining electrons may be trapped in the intermediate layer 135, and thus the life-span of the organic light emitting diode (OLED) display 100 may be improved. Also, when the first organic emission layer 131 and the second organic emission layer 132 are closer to the second electrode 150 than the third organic emission layer 133 the life-span decrease due to the remaining electrons may be larger, however the intermediate layer 125 of the present exemplary embodiment may effectively reduce and/or prevent the life-span decrease.

Also, after an electron inserted through the second electrode 150 is recombined with the hole in the first organic emission layer 131 in the first subpixel SP1, if a remaining electron flows to the third organic emission layer 133, the remaining electrons and holes may be recombined in the third organic emission layer 133, thereby emitting the blue visible rays. Accordingly, in the first subpixel SP1, visible rays in which the blue visible rays and the red visible rays are mixed may be emitted. Likewise, in the second subpixel SP2, the remaining electron may be recombined with a hole in the third organic emission layer 133 such that the mixed visible rays may be emitted in the second subpixel SP2, not the desired green visible rays. This mixture may deteriorate an image quality characteristic of the organic light emitting diode (OLED) display 100. However, in the present exemplary embodiment, the intermediate layer 125 may be disposed between the first organic emission layer 131 and the third organic emission layer 133 and between the second organic emission layer 132 and the third organic emission layer 133 to trap the remaining electron thereby preventing color mixture. Thus, the image quality characteristic of the organic light emitting diode (OLED) display 100 may be improved.

A manufacturing method of the organic light emitting diode (OLED) display according to an exemplary embodiment having the above elements will be described with reference to another drawing.

Figure 2:
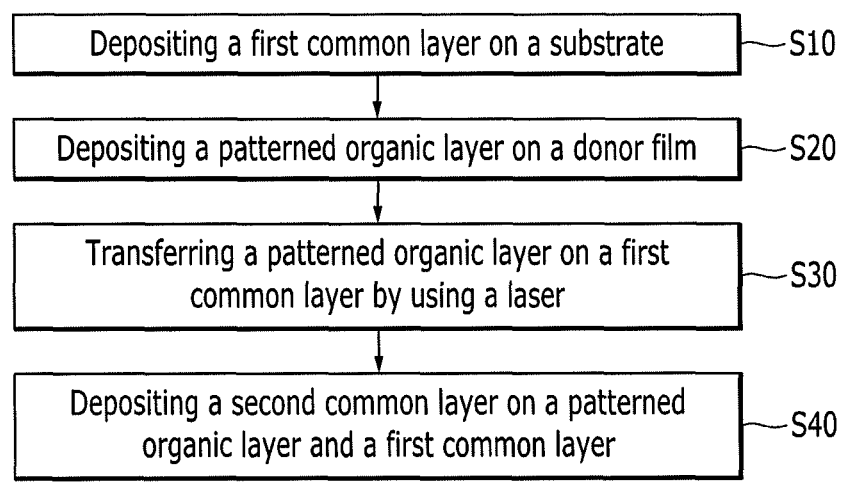
FIG. 2 illustrates a flowchart of a manufacturing method of an organic light emitting diode (OLED) display according to an exemplary embodiment.

FIG. 2 illustrates a flowchart of a manufacturing method of an organic light emitting diode (OLED) display according to an exemplary embodiment.

Referring to FIG. 2, a manufacturing method of an organic light emitting diode (OLED) display according to an exemplary embodiment may include a step of depositing a first common layer on a substrate S10; a step of depositing a patterned organic layer on a donor film S20; a step of transferring the patterned organic layer on the first common layer by using a laser S30; and a step of depositing a second common layer on the first common layer and the patterned organic layer S40.

Figure 3:
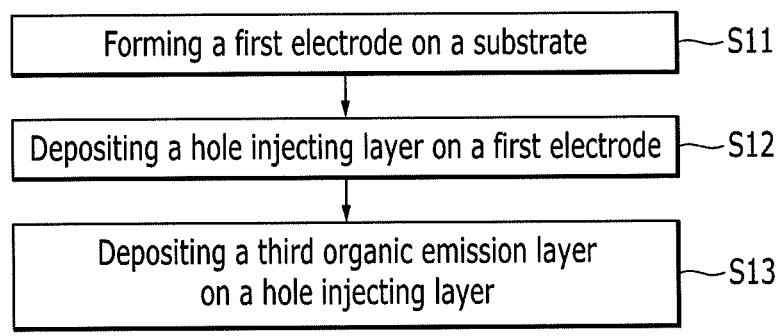
FIG. 3 illustrates a flowchart of a step of depositing a first common layer on a substrate in a manufacturing method of an organic light emitting diode (OLED) display according to an exemplary embodiment.
Figure 4:
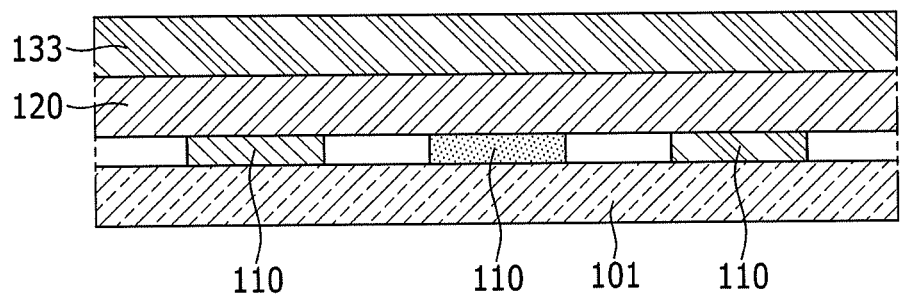
FIG. 4 illustrates a view of a deposited first common layer in a step of depositing the first common layer of FIG. 3.

FIG. 3 illustrates a flowchart of a step of depositing a first common layer on a substrate in a manufacturing method of an organic light emitting diode (OLED) display according to an exemplary embodiment. FIG. 4 illustrates a view of a deposited first common layer in a step of depositing the first common layer of FIG. 3.

Referring to FIG. 3 and FIG. 4, in the step of depositing the first common layer on the substrate S10, the first electrode 110 may be formed on the substrate 101 (S11), the hole injection layer (HIL) 120 may be deposited on the first electrode 110 (S12), and then the third organic emission layer 133 may be deposited on the hole injection layer (HIL) 120 (S13). In the present exemplary embodiment, the third organic emission layer 133 may emit the blue visible rays. At this time, the hole injection layer (HIL) 120 and the third organic emission layer 133 may be commonly positioned in the first subpixel SP1, the second subpixel SP2, and the third subpixel SP3 such that they may be referred to as the first common layer 102 and are entirely formed on the substrate 101.

According to an exemplary embodiment, the patterned organic layer formed on the first subpixel SP1 and the second subpixel SP2 may be deposited on a donor film 200 and may then be transferred by using the laser to be formed on the first common layer 102.

Firstly, a process of depositing the patterned organic layer on the donor film will be described.

Figure 5:
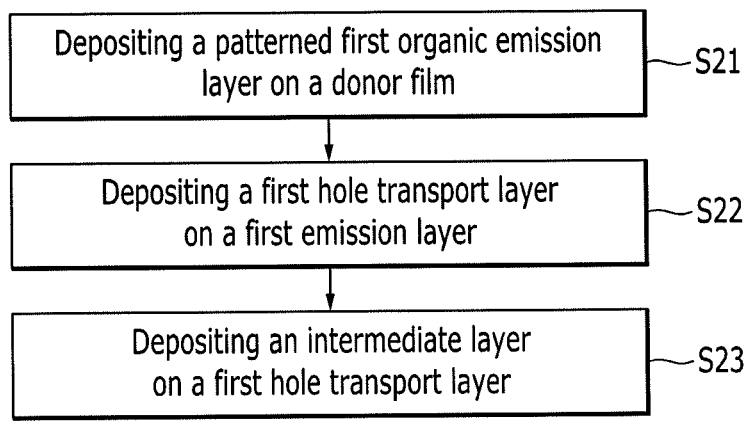
FIG. 5 illustrates a flowchart of one example of depositing a patterned organic layer on a donor film in a manufacturing method of an organic light emitting diode (OLED) display according to an exemplary embodiment.
Figure 6:
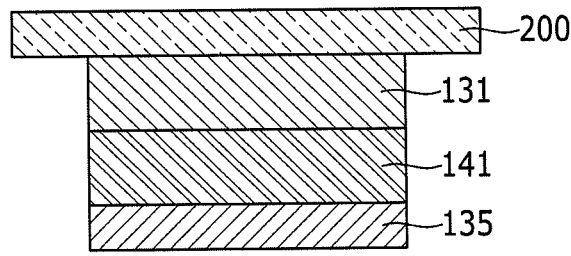
FIG. 6 illustrates a view of one example of a patterned organic layer deposited on a donor film by the step of depositing the patterned organic layer of FIG. 5 on the donor film.

FIG. 5 illustrates a flowchart of one example of depositing a patterned organic layer on a donor film in a manufacturing method of an organic light emitting diode (OLED) display according to an exemplary embodiment. FIG. 6 illustrates a view of one example of a patterned organic layer deposited on a donor film by the step of depositing the patterned organic layer of FIG. 5 on the donor film. At this time, FIG. 6 shows the donor film positioned at a highest side in the drawing, and the organic layer deposited on the donor film is shown to be deposited from the upper side to the lower side in a view of the drawing.

Referring to FIG. 5 and FIG. 6, the step of depositing the organic layer on the donor film (S20) may include a process in which the patterned first organic emission layer 131 is deposited on the donor film 200 (S21), the first hole transport layer (HTL) 141 is deposited on the first organic emission layer 131 (S22), and the intermediate layer 135 is deposited on the first hole transport layer (HTL) 141 (S23). In the present step, the organic layer may be the organic layer positioned in the first subpixel, and at this time, the first organic emission layer 131 may be the organic emission layer emitting the red visible rays. At this time, the organic layer deposited at the donor film 200 may be deposited on the donor film 200 in the reverse sequence that is disposed in the upper direction on the first common layer.

Figure 7:
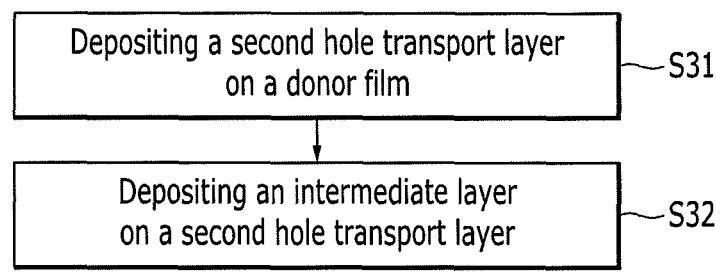
FIG. 7 illustrates a flowchart of another example of depositing a patterned organic layer on a donor film in a manufacturing method of an organic light emitting diode (OLED) display according to an exemplary embodiment.
Figure 8:
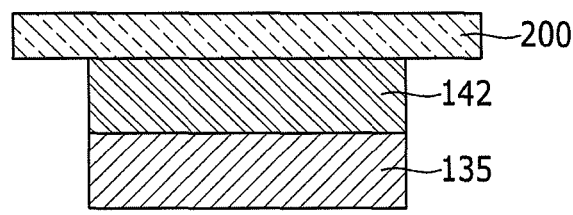
FIG. 8 illustrates a view of one example of a patterned organic layer deposited on a donor film by the step of depositing the patterned organic layer of FIG. 7 on the donor film.

FIG. 7 illustrates a flowchart of another example of depositing a patterned organic layer on a donor film in a manufacturing method of an organic light emitting diode (OLED) display according to an exemplary embodiment. FIG. 8 illustrates a view of one example of a patterned organic layer deposited on a donor film by the step of depositing the patterned organic layer of FIG. 7 on the donor film. FIG. 8 shows the donor film positioned at the uppermost side, and the organic layer deposited on the donor film from the upper side to the lower direction in the view of the drawing.

Referring to FIG. 7 and FIG. 8, the step of depositing the organic layer on the donor film S20 may include the processes of depositing the second hole transport layer (HTL) 142 on the donor film 200 S31 and depositing the intermediate layer 135 on the second hole transport layer (HTL) 142 (S32). In the present step, the organic layer may be the organic layer positioned at the second subpixel SP2, and the organic layer may be deposited on the donor film 200 in the reverse sequence that is disposed in the upper direction on the first common layer 102.

At this time, according to an exemplary embodiment, the second organic emission layer 132 positioned at the second subpixel SP2 may not be deposited on the donor film 200. The second organic emission layer 132 may be deposited and formed directly on the first common layer 102 in the state that the second hole transport layer (HTL) 142 and the intermediate layer 135 positioned at the second subpixel SP2 are positioned on the first common layer 102 by the laser thermal transferring, and this will be described below.

Figure 9:
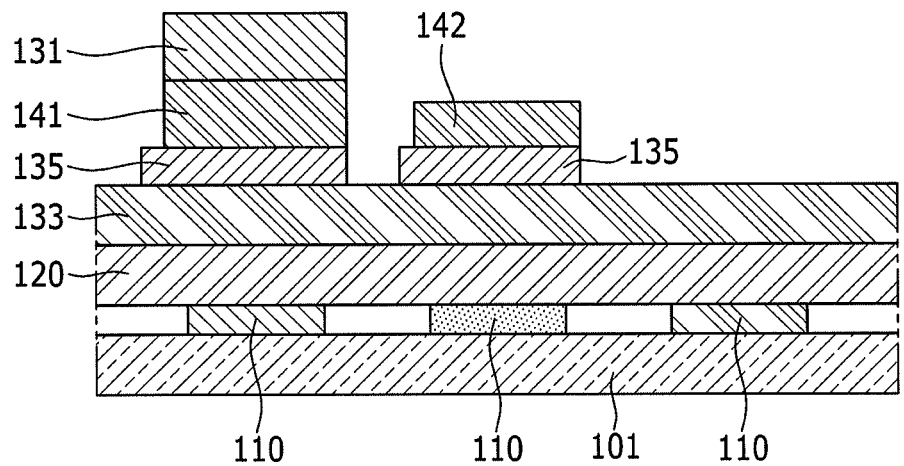
FIG. 9 illustrates a view showing a state of a patterned organic layer transferred on a first common layer by using a laser in a manufacturing method of an organic light emitting diode (OLED) display according to an exemplary embodiment.

FIG. 9 illustrates a view showing a state of a patterned organic layer transferred on a first common layer by using a laser in a manufacturing method of an organic light emitting diode (OLED) display according to an exemplary embodiment.

As described above, the patterned organic layer positioned on the donor film 200 may be thermally transferred by using the laser to the position of the first subpixel SP1 and the second subpixel SP2 (S30). At this time, the laser thermal transferring method may use a suitable method.

In the state that the first organic emission layer 131, the first hole transport layer HTL) 141, and the intermediate layer 135 are positioned on the third organic emission layer 133 of the first subpixel SP1, and the second hole transport layer (HTL) 142 and the intermediate layer 135 are positioned on the third organic emission layer 133 of the second subpixel SP2 by the laser thermal transferring, a process in which a second common layer 104 is deposited may be performed.

Figure 10:
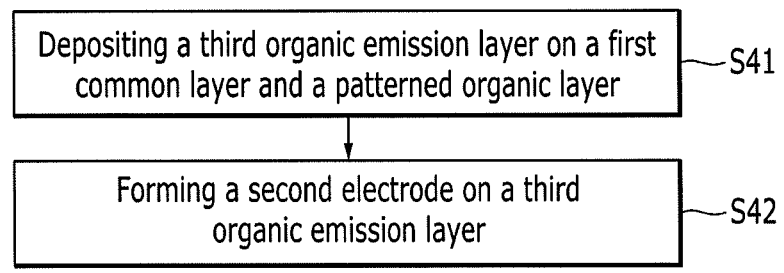
FIG. 10 illustrates a flowchart showing a step of depositing a second common layer on a first common layer and a patterned organic layer in a manufacturing method of an organic light emitting diode (OLED) display according to an exemplary embodiment.
Figure 11:
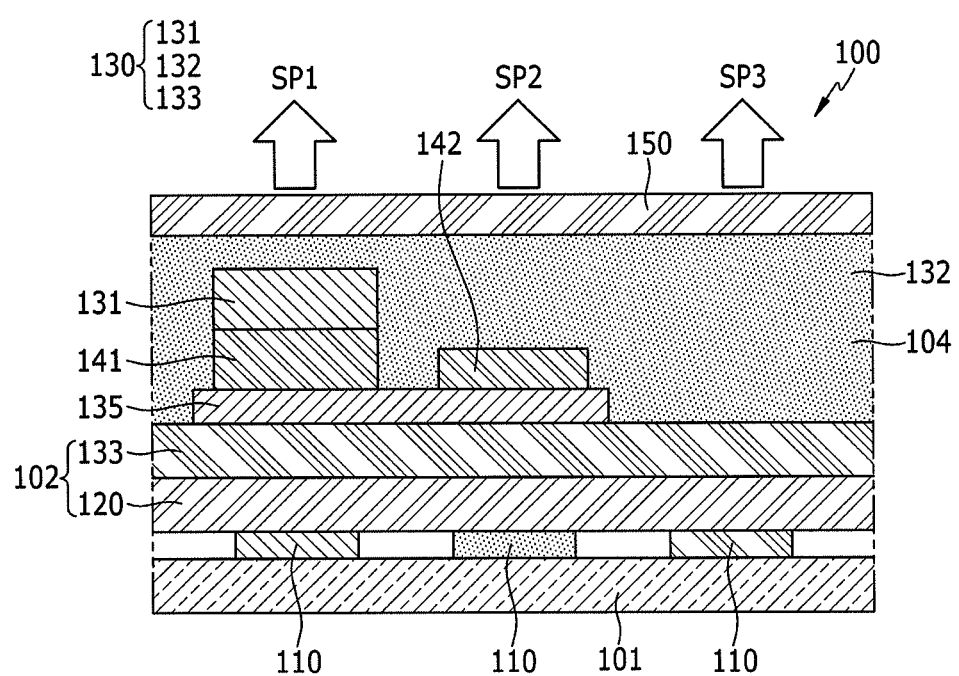
FIG. 11 illustrates a view showing a state of a second common layer deposited on a first common layer and the patterned organic layer of FIG. 10.

FIG. 10 illustrates a flowchart showing a step of depositing a second common layer on a first common layer and a patterned organic layer in a manufacturing method of an organic light emitting diode (OLED) display according to an exemplary embodiment. FIG. 11 illustrates a view showing a state of a second common layer deposited on a first common layer and the patterned organic layer of FIG. 10.

Referring to FIG. 10 and FIG. 11, the step of depositing the second common layer 104 on the first common layer 102 and the patterned organic layer (S40) may include a process of depositing the second organic emission layer 132 on the first common layer 102 and the patterned organic layer and forming the second electrode 150 on the second organic emission layer 132.

According to an exemplary embodiment, the second organic emission layer 132 may be formed as the second common layer 104 commonly positioned in the first to third subpixels SP3. At this time, the thickness of the second organic emission layer 132 positioned at the first to third subpixels SP1, SP2, and SP3 may be thickest in the third subpixel SP3, may have a middle thickness in the second subpixel SP2, and may have a thinnest thickness in the first subpixel SP1. As described above, by differentiating the thickness of the second organic emission layer 132 formed in the first to third subpixels SP1, SP2, and SP3, the distance between the second electrode 150 formed on the second organic emission layer 132 and the first electrode 110 may be the same in the first to third subpixels SP1, SP2, and SP3.

According to an exemplary embodiment, the hole injection layer (HIL) 120 and the third organic emission layer 133 may be formed as the first common layer 102, and the second organic emission layer 132 may be formed as the second common layer 104. In the manufacturing process of the organic light emitting diode (OLED) display according to an exemplary embodiment, the FMM or the patterning layer required to form the organic layer may only be for the first organic emission layer 131, the first hole transport layer (HTL) 141, and the second hole transport layer (HTL) 142. Thus, according to an exemplary embodiment, the organic light emitting diode (OLED) display may be manufactured with only three FMMs.

At this time, according to an exemplary embodiment, when using the laser thermal transferring, the second organic emission layer 132 may be formed as the common layer by the deposition thereof on the patterned organic layer and the third organic emission layer 133 without the laser thermal transferring such that thermal damage caused by the laser is not generated, thereby increasing the life-span.

In the organic light emitting diode (OLED) display according to an exemplary embodiment, the blue organic emission layer and the hole injection layer (HIL) may be deposited as the common layer formed on the substrate to be used as an intermediate connector such that an influence of a bulk resistance of the blue organic emission layer is decreased, and resultantly, a driving voltage, the life-span, and the power consumption characteristic may be improved.

Accordingly, the manufacturing cost of the organic light emitting diode (OLED) display is decreased and the quality thereof may be improved.

Also, in the manufacturing method of the organic light emitting diode (OLED) display according to an exemplary embodiment, the emission layer and the charge transport layer (having the optically optimized thickness) may be simultaneously formed by using the laser thermal transferring method such that color coordinates and efficiency characteristics may be improved, and the display quality may be improved, and the organic light emitting diode (OLED) display of the high resolution may be realized.

By way of summation and review, in an entire deposition process, an independent R, G, and B method requiring a total of five fine metal masks (FMM) by using a number of FMM masks for R, G, B, G', and R' has been considered.

If an organic electric field light emitting element of full color with the above-described structure is manufactured, as each optical thicknesses of R, G, and B pixels are different, a usage frequency of the FMMs may be increased such that a manufacturing cost according to the process and the FMM usage number may be increased. A BCL (blue common layer), as a structure using the blue emission layer as a common layer on the G and R emission layers, may have a merit of decreasing a number of the FMMs used. However, there may be issues in aspects of life-span and efficiency.

By applying the exemplary embodiment of the manufacturing method of the organic light emitting diode (OLED) display according to an embodiment, the organic light emitting element may be manufactured by using only three FMMs.

Although the exemplary embodiments of the present invention are described, the spirit of the present invention is not limited to the exemplary embodiments described in the specification. A person of ordinary skill in the art, understanding the spirit of the present invention, can easily propose other exemplary embodiments by adding, changing, deleting, etc., constituent elements within the scope of the present invention, which should be construed as being included in the scope of the present invention.

<Description of Symbols>

| | | | |
|---|---|---|---|
| 100 | organic light emitting diode (OLED) display | 101 | substrate |
| 110 | first electrode | 120 | hole injection layer (HIL) |
| 130 | organic emission layer | 131 | first organic emission layer |
| 132 | second organic emission layer | 133 | third organic emission layer |
| 135 | intermediate layer | 141 | first hole transport layer (HTL) |
| 142 | second hole transport layer (HTL) | 150 | second electrode |
| 200 | donor film | | |

What is claimed is:

1. An organic light emitting diode (OLED) display including a first subpixel, a second subpixel, and a third subpixel of different colors, the OLED display comprising:
- a substrate;
- a first electrode disposed on the substrate;
- a second electrode disposed on the first electrode to face the first electrode; and
- an organic emission layer disposed between the first electrode and the second electrode, the organic emission layer including a first organic emission layer, a second organic emission layer, and a third organic emission layer,
- wherein the third organic emission layer is commonly disposed on the first electrode in the first subpixel, the second subpixel, and the third subpixel,
- the first organic emission layer is disposed in the first subpixel,
- the second organic emission layer is disposed on the third organic emission layer in the first subpixel, the second subpixel, and the third subpixel,
- an intermediate layer is disposed between the first organic emission layer and the third organic emission layer in the first subpixel and between the second organic emission layer and the third organic emission layer in the second subpixel, and
- a hole transport layer is formed between the first organic emission layer and the intermediate layer in the first subpixel and between the second organic emission layer and the intermediate layer in the second subpixel.

2. The organic light emitting diode (OLED) display of claim 1, wherein a distance from the third organic emission layer to the second electrode is uniform in the first subpixel, the second subpixel, and the third subpixel.

3. The organic light emitting diode (OLED) display of claim 1, wherein a thickness of the second emission layer in the second subpixel is thinner than the thickness of the second emission layer in the third subpixel and is thicker than the thickness of the second emission layer in the first subpixel.

4. The organic light emitting diode (OLED) display of claim 1, wherein the first organic emission layer emits red visible rays, the second organic emission layer emits green visible rays, and the third organic emission layer emits blue visible rays.

5. The organic light emitting diode (OLED) display of claim 1, wherein the intermediate layer includes one selected from the group of hexaazatriphenylene-hexacarbonitrile, $MoO_3$, and fullerene C60.

6. The organic light emitting diode (OLED) display of claim 1, further comprising a hole injection layer that is commonly disposed between the first electrode and the third organic emission layer in the first subpixel, the second subpixel, and the third subpixel.

* * * * *